United States Patent
Amano et al.

(10) Patent No.: US 8,550,470 B2
(45) Date of Patent: Oct. 8, 2013

(54) POSITIONING APPARATUS, A SUBSTRATE PROCESSING APPARATUS AND METHOD FOR FIXING A REFERENCE MEMBER

(75) Inventors: Yoshifumi Amano, Kumamoto (JP); Satoshi Kaneko, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 244 days.

(21) Appl. No.: 13/104,428

(22) Filed: May 10, 2011

(65) Prior Publication Data
US 2011/0308067 A1 Dec. 22, 2011

(30) Foreign Application Priority Data
Jun. 18, 2010 (JP) .................. 2010-139132

(51) Int. Cl.
*B23B 31/28* (2006.01)
(52) U.S. Cl.
USPC ............. 279/3; 279/128; 279/133; 414/781
(58) Field of Classification Search
USPC ............. 279/3, 128, 133, 137; 414/781
IPC ............................................. B23B 31/28
See application file for complete search history.

(56) References Cited

U.S. PATENT DOCUMENTS

| | | | | |
|---|---|---|---|---|
| 2,741,481 A * | 4/1956 | Ortegren | .............. | 279/128 |
| 2,769,642 A * | 11/1956 | Berry | .............. | 279/128 |
| 2,807,180 A * | 9/1957 | Adams | .............. | 82/165 |
| 2,843,389 A * | 7/1958 | Sloan et al. | .............. | 279/3 |
| 4,425,076 A * | 1/1984 | Colineau | .............. | 414/781 |
| 4,655,584 A * | 4/1987 | Tanaka et al. | .............. | 355/53 |
| 4,747,608 A * | 5/1988 | Sato et al. | .............. | 279/155 |
| 5,173,029 A * | 12/1992 | Delventhal et al. | .............. | 414/754 |
| 5,213,348 A * | 5/1993 | Crossman et al. | .............. | 279/126 |
| 5,803,979 A * | 9/1998 | Hine et al. | .............. | 134/2 |
| 6,217,656 B1 * | 4/2001 | Spiering et al. | .............. | 118/500 |
| 6,519,861 B1 * | 2/2003 | Brueck et al. | .............. | 33/507 |
| 7,153,087 B2 * | 12/2006 | Kang et al. | .............. | 414/781 |
| 7,275,749 B2 * | 10/2007 | Matsuzawa et al. | .............. | 279/106 |
| 7,458,762 B2 * | 12/2008 | Han et al. | .............. | 414/781 |
| 7,862,050 B2 * | 1/2011 | Koshino | .............. | 279/133 |
| 2008/0052948 A1 * | 3/2008 | Kim et al. | .............. | 34/317 |
| 2011/0281376 A1 * | 11/2011 | Amano | .............. | 438/5 |
| 2011/0282484 A1 * | 11/2011 | Amano | .............. | 700/114 |

FOREIGN PATENT DOCUMENTS

| | | | | |
|---|---|---|---|---|
| JP | 63138747 A | * | 6/1988 | |
| JP | 2004-342939 A | | 12/2004 | |
| JP | 2007-142077 A | | 6/2007 | |
| JP | 2008-112901 A | | 5/2008 | |
| JP | 2009-130011 A | | 6/2009 | |
| JP | 2009-147152 A | | 7/2009 | |

\* cited by examiner

*Primary Examiner* — Eric A Gates
(74) *Attorney, Agent, or Firm* — Abelman, Frayne & Schwab

(57) ABSTRACT

Provided is a positioning apparatus including: a reference member that is serving as a reference for positioning; a support part that supports the reference member; and a first fixing member provided on the support part that fixes the reference member and the support part or releases the fixing. The reference member is connected to the support part in a movable state and fixed to the support part by the first fixing member after a position is determined. The reference member of the positioning apparatus is precisely installed to a reference position.

4 Claims, 6 Drawing Sheets

POSITIONING APPARATUS, A SUBSTRATE PROCESSING APPARATUS AND METHOD FOR FIXING A REFERENCE MEMBER

CROSS-REFERENCE TO RELATED APPLICATIONS

This application is based on and claims priority from Japanese Patent Application No. 2010-139132, filed on Jun. 18, 2010, with the Japanese Patent Office, the disclosure of which is incorporated herein in its entirety by reference.

TECHNICAL FIELD

The present disclosure relates to a positioning apparatus, a substrate processing apparatus, and a method for fixing a reference member.

BACKGROUND

A semiconductor device, such as a semiconductor memory, is formed by performing a substrate processing, such as depositing, etching, on a substrate, such as a semiconductor wafer. An example of the substrate processing may include a bevel processing performed on a peripheral portion of the substrate, and the bevel processing is performed by a substrate processing apparatus that performs the bevel processing.

The bevel processing is performed while rotating the substrate, such as the semiconductor wafer, and therefore, the center of the substrate needs to be coincided with the rotating center, and as a result, it is important to determine the position of the substrate such as the semiconductor wafer subjected to the bevel processing. The reason is that the bevel processing is performed within a range of several millimeters from a side (end) of the substrate. Therefore, when the substrate is positioned deviated from a predetermined position in a substrate processing apparatus, the desired bevel processing may not be performed, which causes, for example, a reduction in a manufacturing yield of the semiconductor device.

Further, in addition to the substrate processing apparatus that performs the bevel processing, an apparatus performing processing toward the surroundings of the substrate from the center of the substrate, and an apparatus performing the processing toward the center of the substrate from the surroundings of the substrate require a precise positioning of the center of the substrate to the rotating center.

The substrate positioning method is disclosed, for example, in Japanese Patent Application Laid-Open Nos. 2004-342939 and 2009-130011.

SUMMARY

According to an embodiment, a positioning apparatus is provided including; a reference member configured to be served as a reference for a positioning; a support part configured to support the reference member; and a first fixing member provided on the support part configured to fix the reference member and the support part, or release the fixing. In particular, the reference member is connected to the support part in a movable state and fixed to the support part by the first fixing member after a position is determined.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
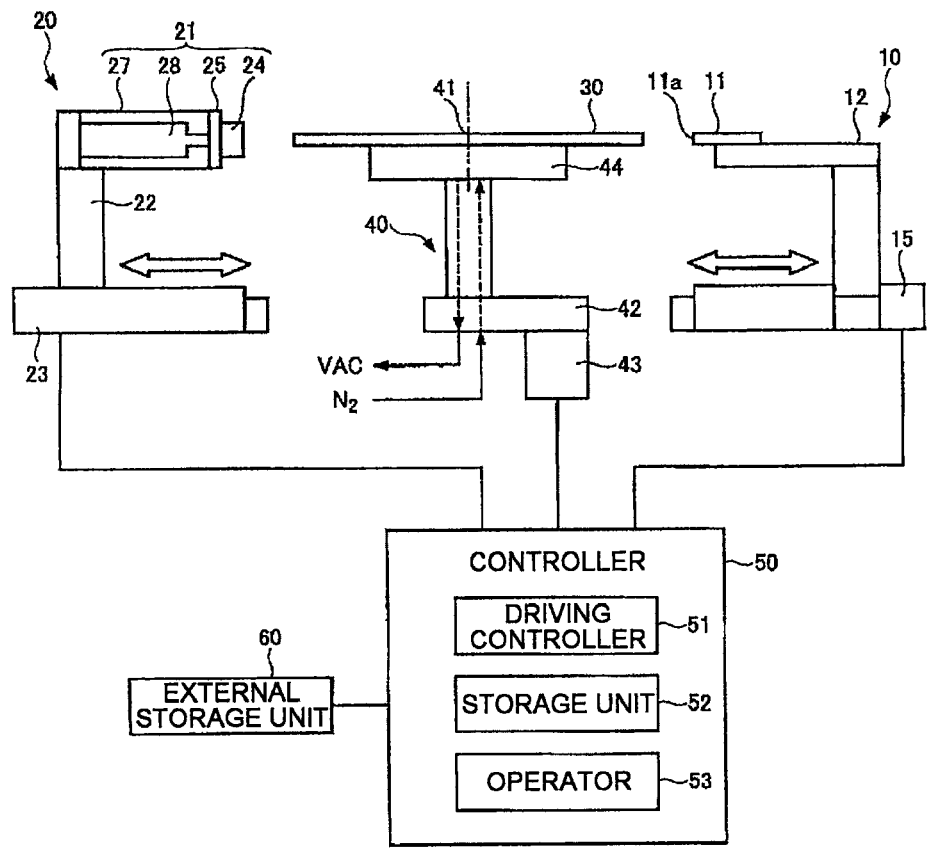
FIG. 1 is a side view of a substrate positioning apparatus according to a first exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The positioning of the substrate is performed using a reference member that becomes a reference for positioning. However, when the position of the reference member is deviated from a predetermined position, the positioning may not be accurately performed.

In particular, when the reference member is fixed to a support part by, for example, a screw, the reference member may be deviated from a predetermined position when the reference member is set at a reference position, and then, firmly tightened by a screw, such that the accurate positioning may not be performed.

The present disclosure has been made in an effort to provide a positioning apparatus configured to set a reference member at a predetermined position, and then, accurately mount the reference member on a support part, a substrate processing apparatus, and a method for fixing the reference member.

An exemplary embodiment of the present disclosure provides a positioning apparatus, including: a reference member serving as a reference for positioning; a support part to support the reference member; and a first fixing member provided on the support part to fix the reference member and the support part, or release the fixing. In particular, the reference member is connected to the support part in a movable state and fixed to the support part by the first fixing member after a position is determined.

The positioning apparatus may further include a movable shaft configured to connect the reference member to the support part in a state in which the reference member is movable. Also, the first fixing member is fixed by any one of a vacuum suction, an electrostatic chuck, and a magnetic chuck.

The positioning apparatus may further include a second fixing member to fix the reference member and the support part in the stat where the reference member is fixed to the support part by the first fixing member. Moreover, the first fixing member includes a control part that fixes the reference member and the support part or releases the fixing, and the controller releases the fixing of the reference member and the support part by the first fixing member, after the reference member and the support part are fixed by the second fixing member.

A substrate processing apparatus may be provided equipped with the positioning apparatus as described above.

According to another embodiment, a method is provided for fixing a reference member including positioning a reference member connected to a support part in a movable state to a reference position; and first fixing the reference member positioned to the reference position by a first fixing member provided on the support part.

In the method described above, the positioning is performed by rotating the support part and the reference member along a movable shaft provided between the support part and the reference member. Also, the first positioning is performed by any one of a vacuum suction, an electrostatic chuck, and a magnetic chuck. Moreover, the method may further includes second fixing the reference member to the support part after the first fixing; and first releasing the fixing by the first fixing member after the second fixing.

As set forth above, the exemplary embodiments of the present disclosure may provide the positioning apparatus configured to set the reference member at the predetermined position and then, accurately mount the reference member on the support part, the substrate processing apparatus, and the method for fixing a reference member.

Exemplary embodiments of the present disclosure will be described below.

First Exemplary Embodiment

Substrate Positioning Apparatus

Figure 2:
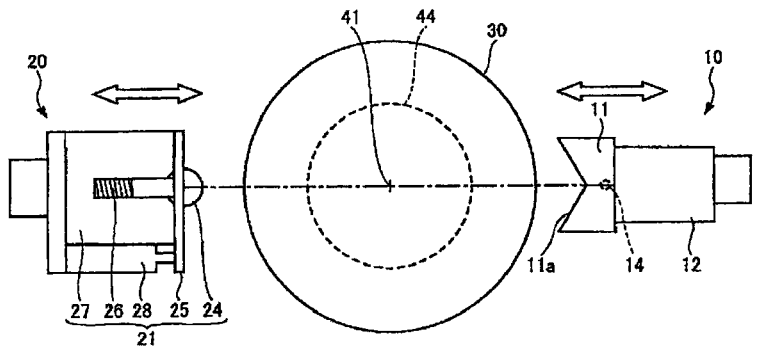
FIG. 2 is a plan view of a substrate positioning apparatus according to the first exemplary embodiment of the present disclosure.

FIG. 1 is a side view of a substrate positioning apparatus according to a first exemplary embodiment of the present disclosure, and FIG. 2 is a plan view of the substrate positioning apparatus according to the first exemplary embodiment of the present disclosure. The substrate positioning apparatus according to the first exemplary embodiment performs the positioning of a circular-shape substrate such as a semiconductor wafer.

The substrate positioning apparatus according to the first exemplary embodiment of the present disclosure includes a first positioning mechanism 10 and a second positioning mechanism 20. First positioning mechanism 10 and second positioning mechanism 20 are disposed at a position opposite to each other with respect to the straight line passing through a rotating center 41 of a rotating part 40 mounting a substrate 30 such as the semiconductor wafer.

First positioning mechanism 10 includes a first reference part 11 that becomes a reference member contacting a side (end) of substrate 30, a support part 12 for supporting first reference part 11, and a first driver 15 linearly moving first reference part 11 in the radial direction of substrate 30 through support part 12. First reference part 11 is formed so that a contact surface 11a contacting substrate 30 may be formed at the side in a V-shape, and contacts two points of the side of circular substrate 30 on contact surface 11a. First reference part 11 may be made of a material that is not deformed, that is, a material such as metal having a low possibility to incorporate impurities. For example, ceramics or a resin material such as polyether, ether, and ketone resin (PEEK) may be used. Support part 12 is formed in an L-shape and one end thereof is provided with first reference part 11. First reference part 11 is rotatably supported along with a pin 14 which becomes a movable shaft to be described below and installed to support part 12, and is fixed to the support part by the method for fixing a reference member to be described below.

First reference part 11 moves (rotates) around pin 14 to be fixed at a position contacting two points of the side of substrate 30, such that first reference part 11 and substrate 30 may be securely contacted at the two points. In addition, the other end of support part 12 is connected to first driver 15. First driver 15 may linearly move first reference part 11 in the radial direction of substrate 30 and is configured by a motor that can stop first reference part 11 at a predetermined position. An example of the motor may include a stepping motor that may relatively accurately perform the position control.

Second positioning mechanism 20 includes a second reference part 21 contacting the side of substrate 30, a support part 22 supporting second reference part 21, and a second driver 23 linearly moving second reference part 21 in the radial direction of substrate 30 through support part 22.

Second reference part 21 includes, for example, a contact part 24, a movable part 25, a spring part 26, a body part 27, and a position sensor 28.

Contact part 24 is formed in a cylindrical shape and is mounted on movable part 25 in a state in which the side of substrate 30 may contact the side of cylindrical contact part 24, in a rotatable state around the center of cylindrical contact part 24. For example, contact part 24 may be configured with, for example, a ball bearing. Movable part 25 is connected to body part 27 through spring part 26, and spring part 26 is mounted so that contact part 24 applies force to body part 27 in a direction toward rotating center 41 of rotating part 40. For this reason, when contacting substrate 30 at contact part 24, spring part 26 is expanded and contracted through movable part 25 to prevent excessive force from being applied to substrate 30. In addition, movable part 25 may measure the relative position of movable part 25 with respect to body part 27 by position sensor 28 mounted in body part 27. As described above, the relative position of contact part 24 contacting substrate 30 with respect to substrate 30 may be detected by measuring the relative position of movable part 25 by position sensor 28. Contact part 24 may be made of a material that is not deformed, that is, a material such as metal having a lower possibility to incorporate impurities. For example, ceramics or a resin material such as polyether, ether, and ketone resin (PEEK) may be used. In addition, as position sensor 28, any position sensor that may detect the position of movable part 25 may be used, and a contact type sensor and a non-contact type sensor such as a magnetic sensor and an optical sensor may be used. In addition, in the first exemplary embodiment of the present disclosure, contact part 24 is formed to relatively move by about 2 mm in the radial direction of substrate 30.

Second reference part 21 is connected to one end of support part 22 and the other end of support part 22 is connected to second driver 23. Second driver 23 may linearly move second reference part 21 in the radial direction of substrate 30. Therefore, second driver 23 may linearly move second reference part 21 up to a predetermined position and is configured of, for example, a linearly movable air cylinder or a linearly movable motor. The linear moving direction of first driver 15 and the linear moving direction of second driver 23 are mounted on the same line, and rotating center 41 of rotating part 40 is present on the line. In addition, second driver 23 is connected to an elevation cylinder that is movable in a vertical direction to the surface of substrate 30, and may move all of second reference part 21, support part 22, and second driver 23 in an approximately vertical direction to the surface of substrate 30.

Figure 3:
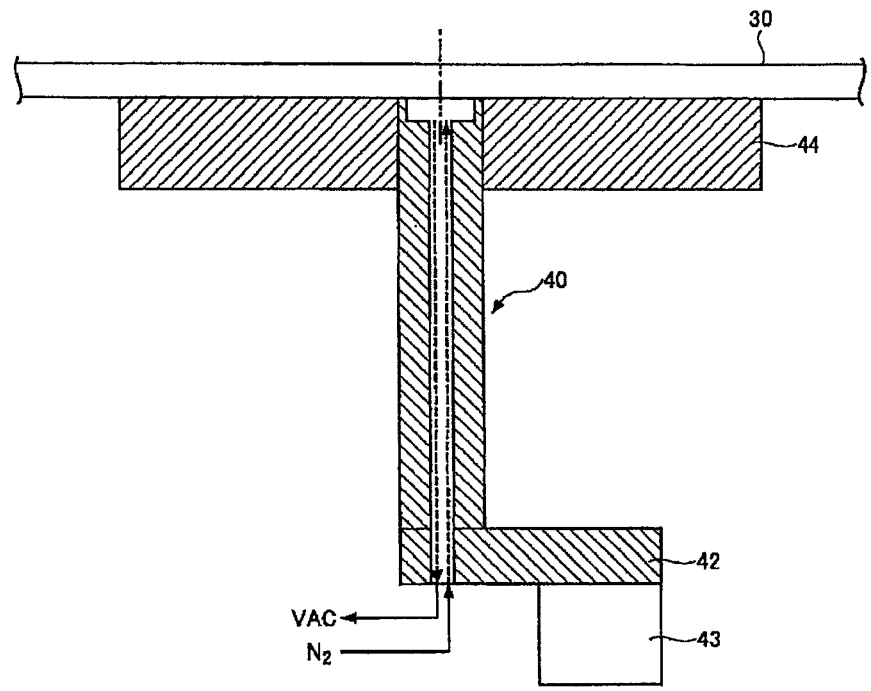
FIG. 3 is a cross-sectional view of a rotating part and a vacuum chuck part.

Rotating part 40 is provided with a motor 43 via a rotating transfer part 42 to rotate substrate 30. In addition, as shown in FIG. 3, a vacuum chuck part 44 serving as an adsorption part of substrate 30 is provided in a surface of rotating part 40 where substrate 30 is positioned, and is connected to, for example, a vacuum pump (not shown). Substrate 30 is disposed on vacuum chuck part 44, and then, the gas is evacuated by, for example, a vacuum pump so that substrate 30 is adsorbed into a opening part (not shown) and a groove (not shown) connected to the opening part that are provided in vacuum chuck part 44. In addition, vacuum chuck part 44 supplies, for example, nitrogen ($N_2$) gas to substrate 30 (nitrogen gas blow), such that substrate 30 may be floated over vacuum chuck part 44.

In the first exemplary embodiment of the present disclosure, a contact position of first reference part 11 at first positioning mechanism 10, rotating center 41 of rotating part 40, and second reference part 21 at second positioning mechanism 20 with substrate 30 are disposed on the same line.

In the first exemplary embodiment of the present disclosure, first positioning mechanism 10, second positioning mechanism 20, rotating part 40, the vacuum pump (not shown) for vacuum-chucking substrate 30 in vacuum chuck part 44, and a valve (not shown) for supplying, for example, nitrogen gas are connected to a controller 50, and thus, controller 50 may control all of the above-mentioned components. In addition, controller 50 is connected to a storage unit 60 which stores programs to allow controller 50 to perform a control. Further, controller 50 includes a driving controller 51 controlling, for example, first positioning mechanism 10, second positioning mechanism 20, and rotating part 40, a memory 52 for storing information on, for example, a reference position, and an operator 53 performing various calculating operations Method for Fixing Reference Member Next, the positioning apparatus and the method for fixing a reference member according to the first exemplary embodiment of the present disclosure will be described below. The method for fixing a reference member according to the first exemplary embodiment of the present disclosure is related to fixing a reference member that requires a position control, and is used for positioning of other members by referring to the position controlled reference member. Hereinafter, the case in which the reference member is a first reference part 11 will be described below.

Figure 4:
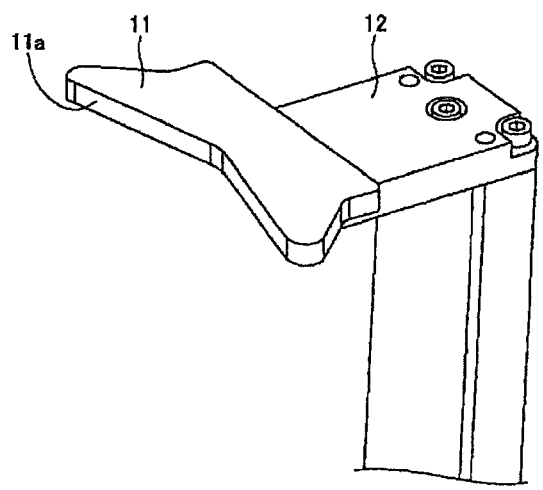
FIG. 4 is a perspective view of an apparatus used for a method for fixing a reference member according to the first exemplary embodiment of the present disclosure.
Figure 5:
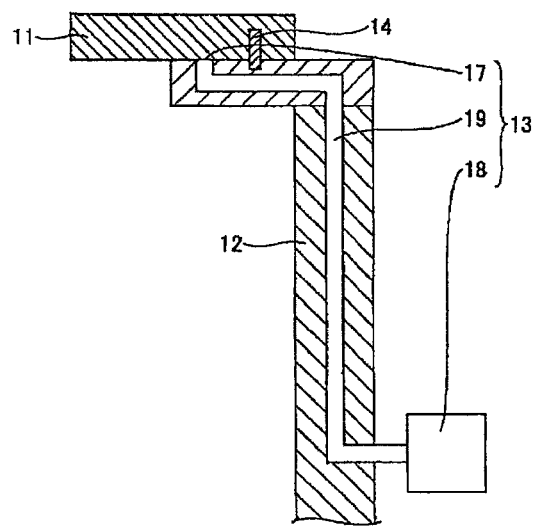
FIG. 5 is a cross-sectional view of a support part used in the first exemplary embodiment of the present disclosure.
Figure 6:
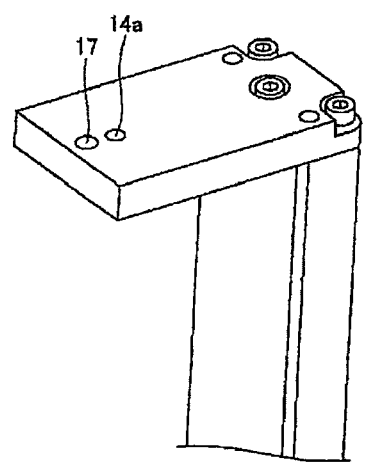
FIG. 6 is a perspective view of the support part used in the first exemplary embodiment of the present disclosure.

An apparatus used for the method for fixing a reference member according to the first exemplary embodiment of the present disclosure will be described with reference to FIGS. 4 to 6. The apparatus used for the method for fixing a reference member according to the first exemplary embodiment of the present disclosure includes first reference part 11 that is the reference member performing, for example, a positioning, a support part 12 supporting first reference part 11, and a fixing mechanism 13 that is the first fixing member for fixing support part 12 and first reference part 11. First reference part 11 has a contact surface 11a formed in a V-shape on a side thereof in order to perform the positioning of other members. Support part 12 and first reference part 11 are connected by a pin 14 serving as a coupling member in a state in which first reference part 11 may rotate around pin 14. For this reason, support part 12 is provided with a pin hole 14a into which pin 14 is inserted. FIG. 4 is a perspective view showing the state in which first reference part 11 and support part 12 are fixed in the first exemplary embodiment of the present disclosure, FIG. 5 is a cross-sectional view of support part 12, and FIG. 6 is a perspective view of support part 12 from which first reference part 11 is separated.

Fixing mechanism 13 is a vacuum chuck and is provided on support part 12. Fixing mechanism 13 includes an opening part 17 for fixing first reference part 11 provided on the contact surface with first reference part 11 at support part 12, a vacuum pump 18, and an exhaust path 19 connecting opening part 17 and vacuum pump 18. The vacuum chuck adsorbs and fixes first reference part 11 into opening part 17 through exhaust path 19 by the exhaustion of vacuum pump 18.

Figure 7:
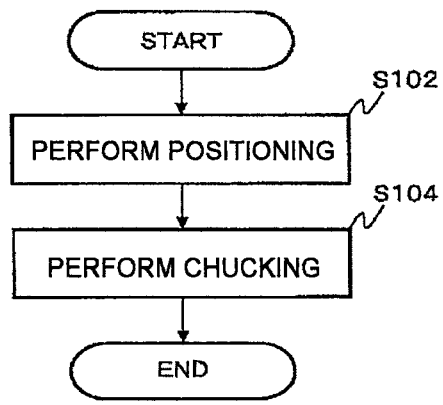
FIG. 7 is a flow chart of the method for fixing a reference member according to the first exemplary embodiment of the present disclosure.

The method for fixing first reference part 11 that is the reference member according to the first exemplary embodiment of the present disclosure will be described with reference to FIG. 7.

A position adjustment of first reference part 11 is performed at S102. In detail, first reference part 11 is rotatably connected to support part 12 by pin 14. For example, when contact surface 11a provided on first reference part 11 contacts the side of a disk type substrate such as the reference substrate or a silicone wafer at two points, the position adjustment is performed by rotating first reference part 11 around pin 14 that is a movable shaft. As a result, contact surface 11a contacts the side of the disk type substrate such as the reference substrate at two points.

Figure 8:
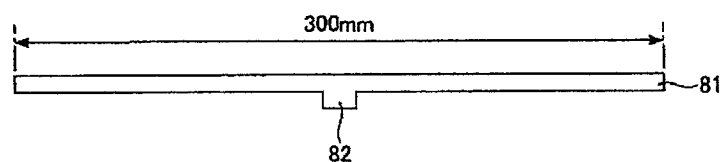
FIG. 8 is a diagram illustrating a reference substrate.

An example of the reference substrate may include a reference substrate 81 shown in FIG. 8. Reference substrate 81 is formed in a circle having 300 mm diameter and the central portion of reference substrate 81 is provided with a convex portion 82. In addition, a portion which is rotating center 41 of the surface of vacuum chuck part 44 is provided with a concave portion corresponding to convex portion 82, and convex portion 82 of reference substrate 81 is inserted into the concave portion of vacuum chuck part 44. As a result, rotating center 41 of rotating part 40 coincides with the center of reference substrate 81. That is, in reference substrate 81, a distance from rotating center 41 of rotating part 40 to the peripheral portion thereof is set to be uniform. Although the first exemplary embodiment of the present disclosure discloses a configuration in which the central portion of reference substrate 81 is provided with convex portion 82 and vacuum chuck part 44 is provided with the concave portion, any method or shape of mounting reference substrate 81 may be used so as to coincide rotating center 41 of rotating part 40 with the center of reference substrate 81 when reference substrate 81 is mounted on vacuum chuck part 44.

Next, the first reference part is fixed at S104. Specifically, first reference part 11 is adsorbed and fixed into opening part 17 through exhaust path 19 by operating vacuum pump 18 at fixing mechanism 13. In the case of the vacuum chuck, since there is no need to tighten when fixing the screw, first reference part 11 is accurately fixed to support part 12 at a position adjusted at S102.

When performing the positioning of the disk type substrate such as a silicon wafer through the contact using first reference part 11 fixed as described above, the accurate positioning of the substrate may be performed.

Although the first exemplary embodiment of the present disclosure discloses the case in which fixing mechanism 13 serving as the first fixing member is the vacuum chuck (vacuum suction), the first fixing member may be an electromagnetic chuck or an electrostatic chuck. The fixing and the fixing release of the reference member by the first fixing member are performed by the control of controller 50. Also, although the first exemplary embodiment of the present disclosure discloses the case in which first reference part 11 is connected to support part 12 by pin 14 which is the coupling member serving as the movable shaft, any movable shafts other than pin 14 may be used as long as first reference member can be connected with a rotatable state or a movable state in a predetermined area.

Although the first exemplary embodiment of the present disclosure discloses the case in which first reference part 11 is serving as a reference member for performing the positioning, any reference members may be used as long as the reference member need to be fixed to an accurate position.

Second Exemplary Embodiment

Next, a positioning apparatus and a method for fixing a reference member according to a second exemplary embodiment of the present disclosure will be described. Reference member 111 of the second exemplary embodiment corresponds to first reference part 11 of the first exemplary embodiment, and the positioning apparatus of the second exemplary embodiment may be applied to the substrate processing apparatus, similar to the first exemplary embodiment of the present disclosure.

The method for fixing a member according to the second exemplary embodiment requires a position control, which is used when the positioning of other components is performed based on the member of which the position is controlled. Additionally, the method of the second exemplary embodiment uses a screw serving as a second fixing member.

Figure 9:
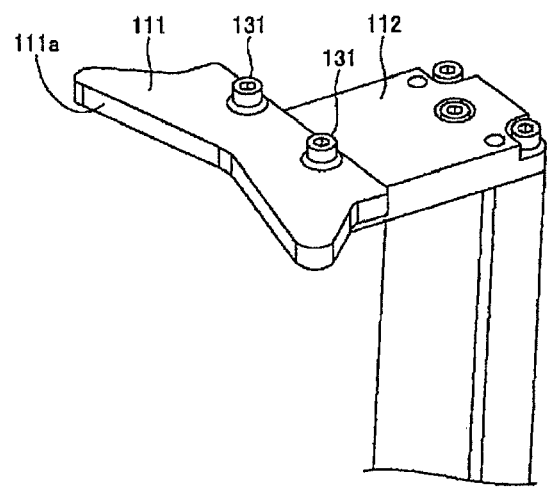
FIG. 9 is a perspective view of an apparatus used for the method for fixing a reference member according to a second exemplary embodiment of the present disclosure.
Figure 10:
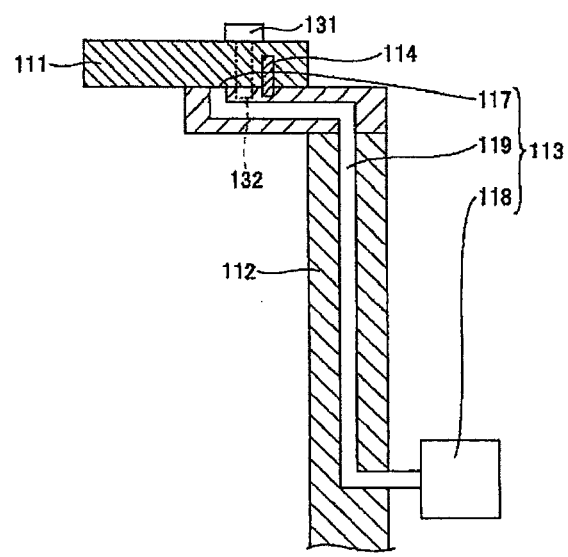
FIG. 10 is a cross-sectional view of the support part used in the second exemplary embodiment.
Figure 11:
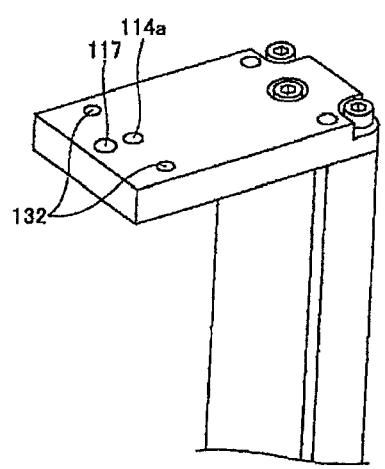
FIG. 11 is a cross-sectional view of the support part used in the second exemplary embodiment of the present disclosure.

An apparatus used for the method for fixing a member according to the second exemplary embodiment of the present disclosure will be described with reference to FIGS. 9 to 11. The apparatus includes first reference member 111 for performing, for example, a positioning, a support part 112 supporting first reference member 111, and a fixing mechanism 113 that is the first fixing member fixing support part 112 and reference member 111, and a screw 131 that is the second fixing member. Reference member 111 has a contact surface 111a formed in a V-shape on a side thereof in order to perform the positioning of other members. Support part 112 and reference member 111 are connected by a pin 114 serving as a movable shaft, in the state in which reference member 111 may rotate around pin 114. For this reason, support part 112 is provided with a pin hole 114a into which pin 114 is inserted. In addition, support part 112 is provided with two screws 131 for fixing reference member 111 to support part 112, and with two screw holes 132 for each of two screws 131. FIG. 9 is a perspective view showing the state in which reference member 111 and support part 112 are fixed in the second exemplary embodiment of the present disclosure, FIG. 10 is a cross-sectional view of support part 112, and FIG. 11 is perspective view of support part 12 in the state where reference member 111 is removed.

Fixing mechanism 113 is a vacuum chuck and is provided on support part 112. Fixing mechanism 113 includes an opening part 117 for chucking reference member 111 provided on the contact surface with reference member 111 at support part 112, a vacuum pump 118, and an exhaust path 119 connecting opening part 117 and vacuum pump 118. The vacuum chuck adsorbs and fixes reference member 111 into opening part 117 through exhaust path 119 by the exhaustion of vacuum pump 118.

Figure 12:
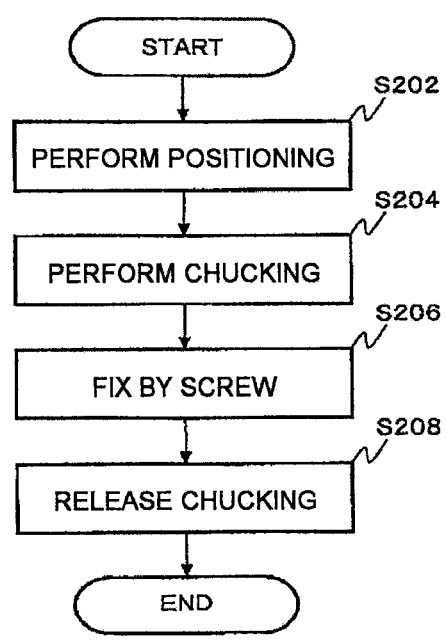
FIG. 12 is a flow chart of the method for fixing a reference member according to the second exemplary embodiment of the present disclosure.

The method for fixing reference member 111 according to the second exemplary embodiment of the present disclosure will be described with reference to FIG. 12.

The position adjustment of reference member 111 is performed first at S202. Specifically, reference member 111 is rotatably connected to support part 112 by pin 114. For example, when contact surface 111a provided on reference member 111 contacts the side of a disk type substrate such as the reference substrate or a silicon wafer at two points, the position adjustment is performed by rotating reference member 111 around pin 114 serving as a movable shaft so that contact surface 111a contacts the side of the disk type substrate at two points.

Next, the reference member is fixed at S204. Specifically, reference member 111 is adsorbed and fixed into opening part 118 through exhaust path 119 by operating vacuum pump 118 at fixing mechanism 113. When fixing the reference member by the vacuum chuck, since there is no need to tighten the reference member by the screw, reference member 111 is accurately fixed to support part 112 at a position adjusted at S202.

Next, reference member 111 is fixed to support part 112 by screw 131 at S206. Specifically, while reference member 111 is fixed to support part 112 by the vacuum chuck at S204, reference member 111 is fixed to support part 112 by screw 131 serving as the second fixing member. Screw 131 is inserted into screw hole 132 formed on support part 112 in order to perform the screw-fixing. Therefore, reference member 111 is fixed to support part 112 not only by the screw-fixing operation of screw 131 but also by the vacuum chuck at fixing mechanism 113.

Next, at step S208, the vacuum chuck at fixing mechanism 113 is released. As a result, while the chucking of support part 112 and reference member 111 is released, support part 112 and reference member 111 are fixed by screw 131.

When reference member 111 is simply fixed to support part 112 by a screw, reference member 111 tends to move when it is tightened such that reference member 111 may not be fixed at the accurate position. However, in the method according to the second exemplary embodiment of the present disclosure, the screw-fixing is performed after the positioning operation by the vacuum chuck is performed, and thus, reference member 111 does not move by the tightening such that reference member 111 may be fixed at the accurate position by the screw.

In addition, after the screw-fixing is performed by screw 131, the vacuum chuck may be released, such that energy for fixing reference member 111 to support part 112 may be reduced.

When performing the positioning of the disk type substrate such as a silicon wafer through the contact using reference member 111 fixed as described above, an accurate positioning of the substrate may be possible.

Although the second exemplary embodiment of the present disclosure describes the case in which fixing mechanism 113 is the vacuum chuck, fixing mechanism 113 may be the electromagnetic chuck or the electrostatic chuck. In addition, although the second exemplary embodiment of the present disclosure discloses the case in which reference member 111 is connected to support part 112 by, for example, pin 114 serving as a coupling member, any movable shafts other than pin 114 may be used as long as reference member 111 can be connected with a rotatable state or a movable state in a predetermined area. In addition, there is no need to use, for example, pin 114 serving as the coupling member as long as reference member 111 can be disposed on support part 112.

Although the second exemplary embodiment of the present disclosure discloses the case of using the screw as the second fixing member, any members that may be physically adhered, such as, for example, a bolt may be used for the second fixing member.

Although the second exemplary embodiment of the present disclosure discloses the case in which reference member 111 is used for performing the positioning operation, any reference members may be used as long as an accurate positioning is possible.

Other contents except for the above description are the same as the first exemplary embodiment.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A positioning apparatus comprising:
   a reference member configured to be served as a reference for a positioning;
   a support part configured to support the reference member;
   a first fixing member provided on the support part including a control part configured to fix the reference member and the support part, or release a fixing between the reference member and the support part; and
   a second fixing member configured to fix the reference member and the support part in a state where the reference member is fixed to the support part by the first fixing member,
   wherein the reference member is connected to the support part in a movable state and fixed to the support part by the first fixing member after a position is determined, and
   the control cart releases the fixing between the reference member and the support part by the first fixing member, after the reference member and the support part are fixed by the second fixing member.

2. The apparatus of claim 1, further comprising a movable shaft configured to connect the reference member to the support part in a state in which the reference member is movable.

3. The apparatus of claim 1, wherein the first fixing member is fixed by any one of a vacuum suction, an electrostatic chuck, and a magnetic chuck.

4. A substrate processing apparatus having the positioning apparatus claimed in claim 1 for determining the position of a substrate.

* * * * *